(12) United States Patent
Brown et al.

(10) Patent No.: US 8,570,076 B2
(45) Date of Patent: Oct. 29, 2013

(54) PARALLEL PATH FREQUENCY DIVIDER CIRCUIT

(75) Inventors: Gary L. Brown, San Diego, CA (US); Alberto Cicalini, San Diego, CA (US); Dongjiang Qiao, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 253 days.

(21) Appl. No.: 12/829,107

(22) Filed: Jul. 1, 2010

(65) Prior Publication Data

US 2012/0001666 A1 Jan. 5, 2012

(51) Int. Cl.
*H03B 19/06* (2006.01)
(52) U.S. Cl.
USPC .......................................... 327/118; 327/117
(58) Field of Classification Search
USPC .................. 327/115, 117, 118; 377/47, 48
See application file for complete search history.

(56) References Cited

U.S. PATENT DOCUMENTS

| 6,411,669 | B1 | 6/2002 | Kim |
| 6,614,870 | B1 | 9/2003 | Miller |
| 7,230,461 | B1 | 6/2007 | Savoj |
| 2003/0052740 | A1 | 3/2003 | Salmi et al. |
| 2005/0219000 | A1 | 10/2005 | Wu |
| 2008/0186063 | A1* | 8/2008 | Jewett ........................... 327/117 |
| 2010/0240323 | A1* | 9/2010 | Qiao et al. ....................... 455/75 |

OTHER PUBLICATIONS

International Search Report and Written Opinion—PCT/US2011/042856—ISA/EPO—Dec. 21, 2011.

* cited by examiner

*Primary Examiner* — Lincoln Donovan
*Assistant Examiner* — Diana J Cheng
(74) *Attorney, Agent, or Firm* — S. Hossian Beladi

(57) ABSTRACT

A parallel path frequency divider (PPFD) includes a low power frequency divider and a high speed latch. A first portion of an oscillating input signal present on an input node of the PPFD is communicated to the divider and a second portion is communicated to the latch. The divider generates a frequency divided enable signal that is communicated to the latch. The latch generates a divided down output signal based on the oscillating input signal and the enable signal. The output signal is insensitive to phase noise present on the enable signal as long as the phase noise on the enable signal is less than one-half of the period of oscillation of the oscillating input signal. Because the noise generated by the low power frequency divider is not propagated to the output signal generated by the PPFD, the PPFD generates low noise, frequency divided signals with relatively low power consumption.

21 Claims, 12 Drawing Sheets

FREQUENCY DIVIDER IN RECEIVE CHAIN OF
A RF TRANSCEIVER

PARALLEL PATH FREQUENCY DIVIDER CIRCUIT

BACKGROUND INFORMATION

1. Technical Field

The disclosed embodiments relate generally to frequency dividers, including frequency dividers operable in wireless communication systems.

2. Background Information

For some applications, such as wireless communication systems it is useful to include a frequency divider circuit. In one example, a frequency divider receives an oscillatory input signal, frequency divides the input signal, and generates a divided-down oscillatory output signal. The frequency division is characterized as frequency division by an integer. Within a wireless communication system, frequency dividers see frequent use as part of a radio transceiver (transmitter/receiver). In one example within a radio transceiver, a frequency divider may be used to receive an oscillatory signal from a Local Oscillator (LO), divide-down the oscillatory signal in frequency, and generate two lower frequency output signals: a differential in-phase (I) output signal and a differential quadrature (Q) output signal. The frequencies of output signals I and Q may, for example, be half the frequency of the input signal. The Q output signal is of the same frequency as the I output signal, but shifted ninety degrees in phase with respect to the I output signal. As such, differential output signals I and Q are said to be in phase quadrature. The set of divided-down output signals may, for example, be supplied to a mixer in a receive chain of the radio transceiver. This is but one application of a frequency divider within a wireless communication system. Frequency dividers may also see use within a Phase-Locked Loop within a local oscillator, or may also be used to frequency divide signals in other places within the wireless communication system circuitry.

FIG. 1 (Prior Art) is a diagram of a type of frequency divider circuit 1. Frequency divider 1 includes divider circuitry 2 to frequency divide differential input signal LO and circuitry 3 to generate a divided-down signal with a twenty five percent duty cycle. Frequency divider 1 receives differential input signal LO involving signal LO+ on conductor 4 and signal LO– on conductor 5. Divider 1 generates two differential output signals, I and Q. Differential output signal I involves signal I+ on conductor 6 and signal I– on conductor 7. Differential output signal Q involves signal Q+ on conductor 8 and signal Q– on conductor 9. Frequency divider 2 receives input signal LO and divides input signal LO in frequency. Circuitry 3 receives signals from divider 2, but does not receive input signal LO. In this manner frequency divider 2 and circuitry 3 are arranged in series. In one example, frequency divider 2 is operable to frequency divide input signal LO by integer two and generate output signals in phase quadrature at fifty percent duty cycle. Circuitry 3 is operable to generate output signals in phase quadrature at twenty five percent duty cycle. Because divider 2 and circuitry 3 are arranged in series, noise generated by divider 2 is propagated through circuitry 3 to output signal, I and Q. Although, the circuit of FIG. 1 operates satisfactorily in some applications, it has limitations. In one example, a frequency divider, as depicted in FIG. 1 consumes more than twenty milliamps of current to perform a divide-by-four operation to generate differential output signals, I and Q, within a phase noise specification of less than ten picoseconds.

In practical circuit design, the input signal from a local oscillator is communicated over a signal line that often exceeds one millimeter in length. Over this distance, power losses along the line tend to attenuate the amplitude of the oscillatory signal. To overcome these losses and deliver a rail to rail signal to the divider, a more powerful signal must be transmitted by the local oscillator, resulting in undesirable levels of power consumption. In applications such as in a radio transceiver of a battery powered cellular telephone, it may be desired to operate a frequency divider that receives attenuated oscillatory input signals and generates low phase noise, rail to rail I and Q signals with minimal power consumption.

SUMMARY

A parallel path frequency divider (PPFD) includes a low power frequency divider circuit and a high speed latch circuit. A first portion of an input signal present on an input node of the PPFD is communicated to the divider circuit and a second portion is communicated to the latch circuit. The divider circuit generates a frequency divided enable signal that is communicated to the latch circuit. The latch circuit generates a divided down output signal that is insensitive to phase noise present on the enable signal as long as the phase noise on the enable signal is less than one-half of the period of oscillation of the input signal. Because the noise generated by the low power frequency divider is not propagated to the output signal generated by the PPFD, the PPFD generates low noise, frequency divided signals with relatively low power consumption.

In one embodiment, the PPFD involves two low power frequency divider circuits and two high speed latch circuits. Each frequency divider circuit receives a portion of a differential input signal, divides the input signal in frequency by an integer value, and outputs a differential enable signal. A first of the differential enable signals is an in-phase (I) differential enable signal generated by the first frequency divider circuit. A second of the differential enable signals is a quadrature (Q) differential enable signal generated by the second frequency divider circuit. The I and Q enable signals are approximately ninety degrees out of phase with one another, and thus are in phase quadrature. The I differential enable signal is communicated to a first high speed latch circuit. The first high speed latch also receives a portion of the differential input signal and generates a divided down output signal, I. The Q differential enable signal is communicated to a second high speed latch circuit. The second high speed latch also receives a portion of the differential input signal and generates a divided down output signal, Q. The I and Q output signals are approximately ninety degrees out of phase with one another, and thus are in phase quadrature.

Because a portion of the differential input signal is communicated to the low power frequency divider circuits and the remaining portion is communicated to the high speed latch circuits, the input signal is divided into two parallel paths. Each high speed latch circuit generates an output signal based on a portion of the differential input signal and an enable signal generated by a low power frequency divider circuit. By operation of the latch circuit, a frequency divided output signal is generated that is insensitive to phase noise present on the enable signal generated by the low power frequency divider. For this reason, low power frequency divider circuits may be constructed from relatively small transistors that consume less power and can be driven to generate rail to rail output signals with relatively small input current. In addition, the high speed latch circuits may be constructed to consume a relatively small amount of power because they require relatively few transistors to realize the relatively simple latch function. In one example, each frequency divider includes two tri-state inverters and an inverter configured to operate as a D-latch circuit. In the same example, each high speed latch circuit includes only three transistors configured to operate as a latch circuit.

In a second embodiment, each frequency divider circuit is programmable. Each programmable low power frequency divider operates to frequency divide a differential input signal, LO by a selectable integer value, N. In one example, a programmable frequency divider frequency divides differential input signal LO by a factor of two in one configuration and by a factor of four in another configuration. Selectable integer value, N, is determined by a binary digital selection signal. Based on the selection signal value, each divider is configured to frequency divide differential input signal LO by the desired integer value.

The foregoing is a summary and thus contains, by necessity, simplifications, generalizations and omissions of detail; consequently, those skilled in the art will appreciate that the summary is illustrative only and does not purport to be limiting in any way. Other aspects, inventive features, and advantages of the devices and/or processes described herein, as defined solely by the claims, will become apparent in the non-limiting detailed description set forth herein.

DETAILED DESCRIPTION

Figure 1:
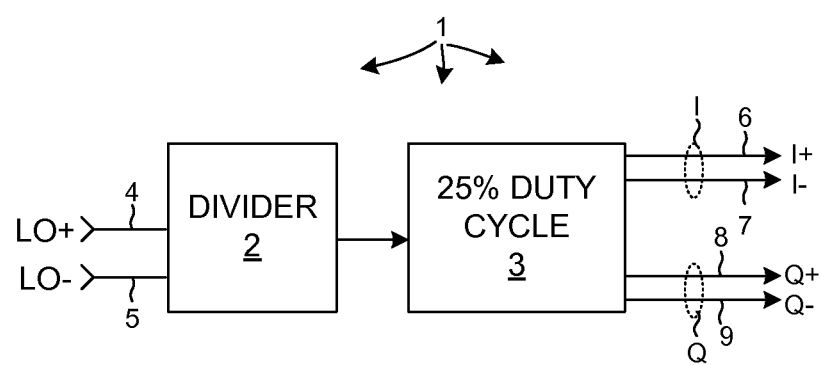
FIG. 1 (Prior Art) is a diagram of a frequency divider including frequency divider circuitry arranged in series.
Figure 2:
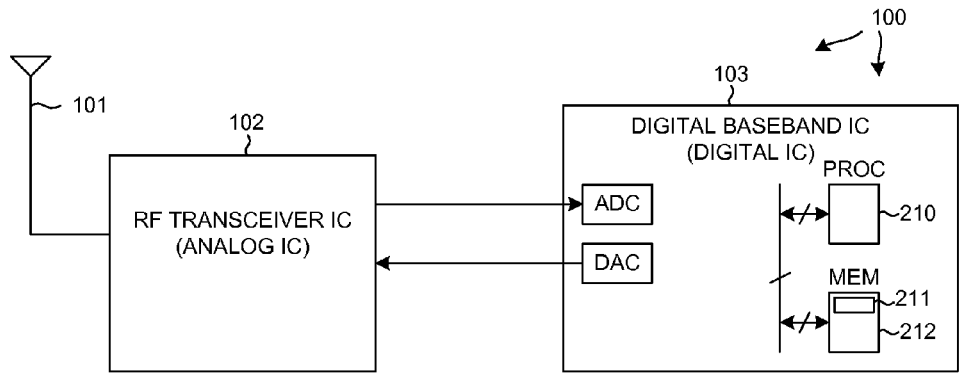
FIG. 2 is a simplified diagram of a mobile communication device 100 that employs a frequency divider 113 in accordance with one novel aspect.

FIG. 2 is a very simplified high level block diagram of a mobile communication device 100 such as a cellular telephone. Device 100 includes (among other parts not illustrated) an antenna 101 usable for receiving and transmitting cellular telephone communications, an RF transceiver integrated circuit 102, and a digital baseband integrated circuit 103.

Figure 3:
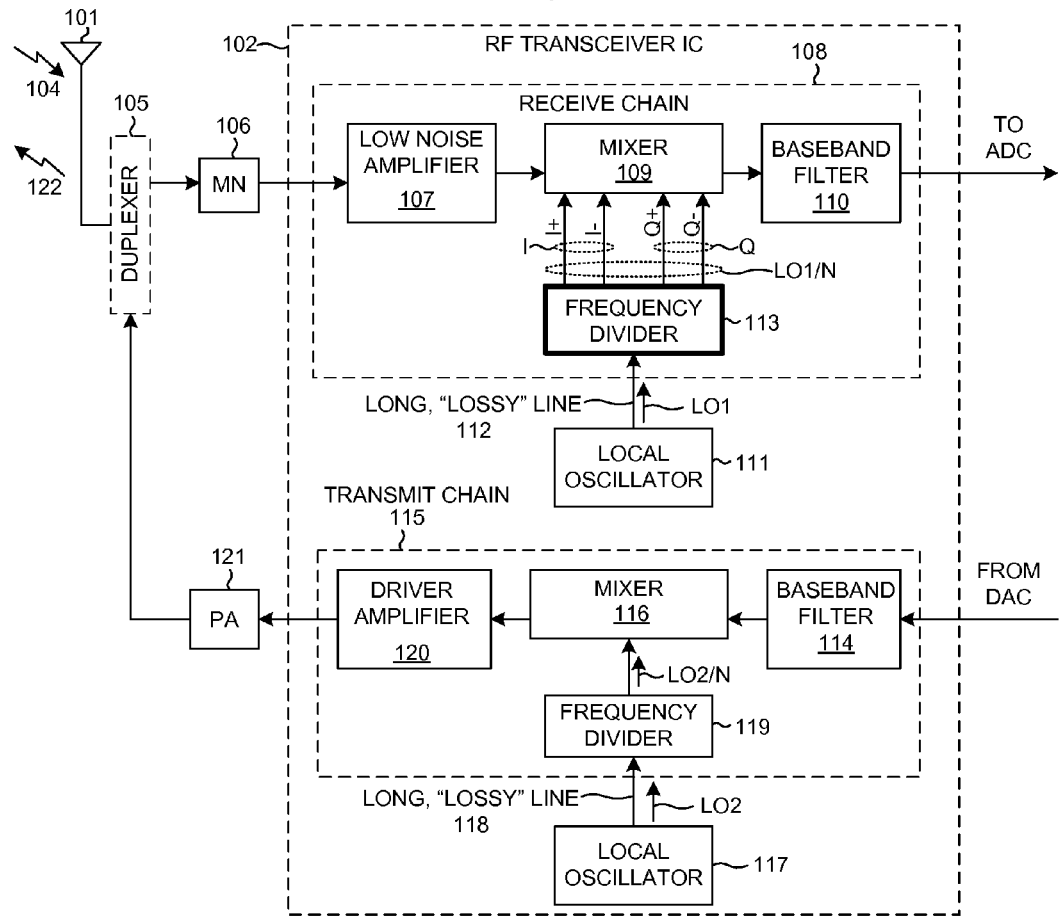
FIG. 3 is a more detailed diagram of RF transceiver integrated circuit 102 of FIG. 2.

FIG. 3 is a more detailed diagram of the RF transceiver integrated circuit 102 of FIG. 2. In one very simplified explanation of the operation of the cellular telephone, if the cellular telephone is being used to receive audio information as part of a cellular telephone conversation, then an incoming transmission 104 is received on antenna 101. The signal passes through duplexer 105 and a matching network 106 and is amplified by a Low Noise Amplifier (LNA) 107 of a receive chain 108. After being downconverted in frequency by a mixer 109 and after being filtered by baseband filter 110, the information is communicated to the digital baseband integrated circuit 103 for analog-to-digital conversion and further processing in the digital domain. As part of the downconversion process, mixer 109 receives a divided-down oscillatory signal LO1/N generated by frequency divider 113 and uses this signal to downconvert information processed by the receive chain 108. What is referred to as divided-down oscillatory signal LO1/N actually includes two differential signals, I and Q. Each of differential signals I and Q is communicated across a set of two conductors. Frequency divider 113 is in close physical proximity to the circuitry of receive chain 108. Frequency divider 113 receives a local oscillator signal LO1, divides the signal in frequency by an integer N, and outputs divided-down oscillatory signal LO1/N. Local oscillator signal LO1 is generated by local oscillator 111. LO1 may, for example, be a differential signal transmitted over two conductors. In other examples, LO1 may be a single ended signal transmitted over a single conductor. LO1 is transmitted over a long, "lossy" line 112 to frequency divider 113. As explained below, signal LO1 suffers parasitic power losses during transmission across long, "lossy" line 112. These losses attenuate the peak to peak signal amplitude of LO1 and high frequency components of LO1.

If, on the other hand, the cellular telephone 100 is being used to transmit audio information as part of a cellular telephone conversation, then the audio information to be transmitted is converted into analog form in digital baseband integrated circuit 103. The analog information is supplied to a baseband filter 114 of a transmit chain 115 of RF transceiver integrated circuit 102. After filtering, the signal is upconverted in frequency by mixer 116. As part of the upconversion process, mixer 116 receives a divided-down oscillatory signal LO2/N generated by frequency divider 119 and uses this signal to upconvert information processed by the transmit chain 115. The resulting upconverted signal is amplified by a driver amplifier 120 and an external power amplifier 121. The amplified signal is supplied to antenna 101 for transmission as outgoing transmission 122. Divided-down oscillatory signal LO2/N includes two differential signals, I and Q. Frequency divider 119 receives a local oscillator signal LO2, divides the signal in frequency by an integer divisor N, and outputs divided-down oscillatory signal LO2/N. Local oscillator signal LO2 is generated by local oscillator 117. LO2 may, for example, be a differential signal transmitted over two conductors. In other examples, LO2 may be a single ended signal transmitted over a single conductor. LO2 is transmitted over a long, "lossy" line 118 to frequency divider 119 that resides in close proximity to the circuitry of transmit chain 115. During transmission over long, "lossy" line 118 signal LO2 suffers parasitic power losses that attenuate its peak to peak amplitude and high frequency components.

Figure 4:
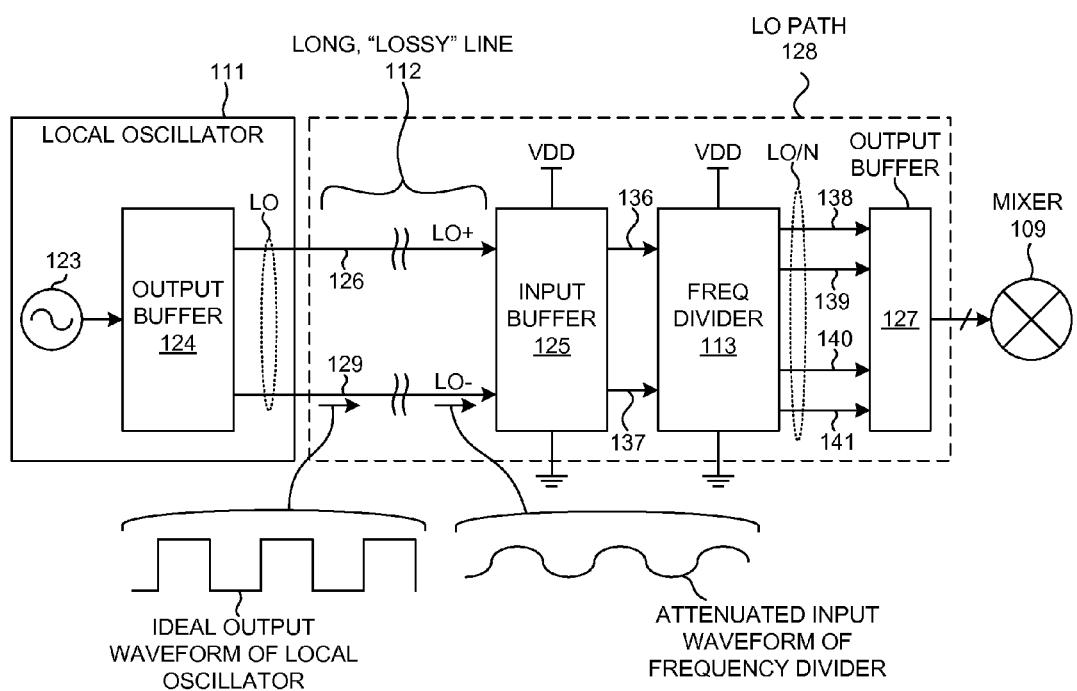
FIG. 4 is a diagram of the operation of frequency divider 113 within receive chain 108 of RF transceiver integrated circuit 102 of FIG. 3.

FIG. 4 illustrates the communication of oscillatory signals from local oscillator 111 to mixer 109 within the local oscillator (LO) path 128 of receive chain 108 of RF transceiver integrated circuit 102 of FIG. 3 in greater detail. Local oscillator 111 includes voltage controlled oscillator (VCO) 123 and output buffer 124. VCO 123 generates a sinusoidal oscillatory signal characterized by an oscillation frequency. In one example, VCO 123 generates a sinusoidal signal oscillating at approximately 4 Ghz. The output signal of VCO 123 is amplified and transformed to differential signal, LO, by output buffer 124. Differential signal LO involves signal LO+ communicated on conductor 126 and signal LO− communicated on conductor 129. As depicted, at the output of output buffer 124, signal LO approximates a square wave oscillating at the oscillation frequency of the sinusoidal oscillatory signal generated by VCO 123. Long, "lossy" line 112 of LO path 128 includes conductor 126 communicating signal LO+ and conductor 129 communicating signal LO−. In other examples, local oscillator 111 may generate a single ended signal and line 112 may include only a single conductor communicating a single ended input signal. In a wireless communication system such as a battery powered cellular telephone, local oscillator 111 supplies oscillatory signals to a variety of sub-circuits. Thus, it is not possible to construct local oscillator 111 in close physical proximity to each sub-circuit. As a result, local oscillator 111 is often not in close physical proximity to frequency divider 113 of receive chain 108. For example, long, "lossy" line 112 is one millimeter or more in length. Because of this length, an oscillatory signal communicated over line 112 falls prey to several power loss mechanisms. Capacitive coupling to the die substrate has a low-pass filter effect on high frequency oscillatory signals transmitted over line 112. Electro-magnetic radiation losses also attenuates the amplitude of a high frequency signal transmitted over line 112 and the charging/discharging of line 112 causes ½ $cv^2f$ losses. Due to its length, line 112 acts like an antenna and high frequency signals transmitted over line 112 suffer radiation losses. As a result of these power losses, an oscillatory signal transmitted over line 112 suffers attenuation of peak to peak signal amplitude and attenuation of high frequency components. For example, a waveform of signal LO from local oscillator 111 measured in close physical proximity to local oscillator 111 may closely resemble an ideal square wave. However, the same signal measured in close proximity to input buffer 125 may be attenuated in amplitude and high frequency components. For purposes of illustration, the transitions of the square wave are heavily attenuated and appear as rounded corners at each transition. Although these power losses can be overcome by increasing the transmission power, this results in an undesirable increase in power consumption. Thus, frequency divider 113 in conjunction with input buffer 125 should be able to frequency divide the attenuated input signal reliably and with a minimum of power consumption.

Input buffer 125 receives differential signal LO communicated over conductors 126 and 129. Input buffer 125 generates a square wave differential signal LO from the attenuated differential signal LO. The required phase noise and current level of the signal generated by input buffer 125 determines the power consumed by input buffer 125. Input buffer 125 requires larger transistors as phase noise requirements become stricter and as the required current level of the generated signal increases. To reduce the amount of power consumed by input buffer 125 frequency divider 113 should be configured to operate within the output phase noise specification with a minimum of input current supplied by input buffer 125. In one example, frequency divider 125 consumes less than six milliamps to perform a divide-by-four operation within an output phase noise specification of less than ten picoseconds.

Frequency divider 113 is coupled to output buffer 127 by conductors 138, 139, 140, and 141. Frequency divider 113 is coupled to input buffer 125 by conductors 136 and 137. Frequency divider 113 receives differential input signal LO involving signal LO+ on conductor 136 and signal LO− on conductor 137. Frequency divider 113 generates a divided-down output signal LO/N by frequency dividing input signal LO by integer, N. LO/N includes two differential output signals, I and Q. Differential output signal I involves signal I+ on conductor 138 and signal I− on conductor 139. Differential output signal Q involves signal Q+ on conductor 140 and signal Q− on conductor 141. Together I+, I−, Q+, and Q− are four divided-down oscillatory signals in phase quadrature. As explained below, all four signals approximate a frequency divided version of the input waveform LO, but each of the four signal representations are characterized by a difference of approximately ninety degrees of phase.

Output buffer 127 is coupled to mixer 109. Mixer 109 includes buffer stages with inverter circuitry. Inverter based mixer buffer stages are used for their power efficient operational characteristics. However, they require approximately rail to rail input waveforms to operate reliably. Thus, output buffer 127 is employed to generate differential output signals, I and Q that approximate ideal rail to rail amplitude waveforms to reliably drive mixer 109. In operation, output signals I+, I−, Q+, and Q− oscillate between a maximum voltage within a few tens of millivolts of the circuit supply voltage, VDD, and a minimum voltage within a few tens of millivolts of circuit ground voltage, VSS. Mixer buffer stages of mixer 109 operate reliably when driven from output signals I+, I−, Q+, and Q− from output buffer 127.

Figure 5:
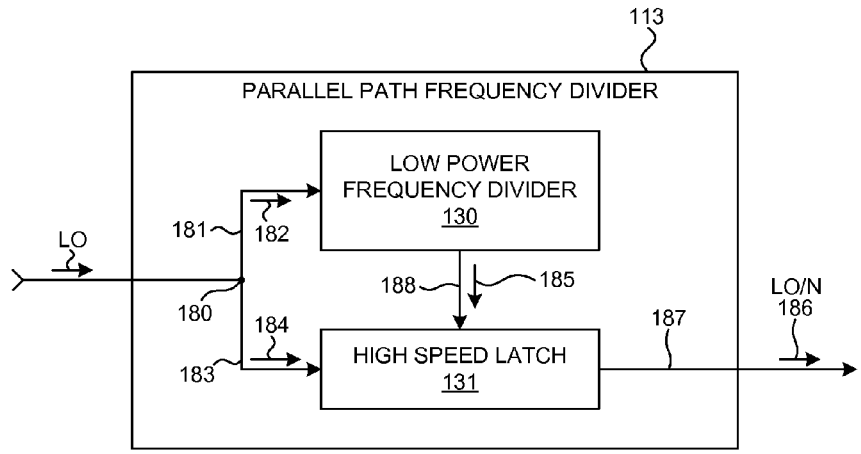
FIG. 5 is a detailed diagram of parallel path frequency divider 113 of the receive chain 108 of the RF transceiver integrated circuit 102 of FIG. 4.

FIG. 5 is illustrative of a parallel path frequency divider (PPFD) 113 of the receive chain 108 of the RF transceiver integrated circuit 102 of FIG. 3. PPFD 113 includes low power frequency divider circuit 130, high speed latch circuit 131, input node 180, and output lead 187. Low power frequency divider 130 is coupled to high speed latch 131 by conductor 188. Output lead 187 is coupled to high speed latch 131. Input node 180 is coupled to low power frequency divider 130 by conductor 181. Input node 180 is also coupled to high speed latch 131 by conductor 183. Input signal LO, present on input node 180 is divided in current into two portions, signal portion 182 and signal portion 184. Signal 182 is communicated to low power frequency divider 130 over conductor 181 and signal 184 is communicated to high speed latch 131 over conductor 183. Low power frequency divider 130 receives signal 182 and generates an enable signal 185 that is communicated to high speed latch 131 over conductor 188. Enable signal 185 is divided down in frequency from LO to a lower frequency. In one example, low power frequency divider 130 divides input signal LO by two in frequency. High speed latch 131 receives both signal 184 and enable signal 185 and generates divided down output signal 186 communicated over output lead 187. In this manner, input signal LO is divided into two parallel portions. The first portion 182 is divided down in frequency by low power frequency divider 130 to generate enable signal 185. Enable signal 185 complies with a lenient specification on phase noise relative to the specification on phase noise for output signal 186. For example, phase noise present on enable signal 185 may be up to half of the period of oscillation of input signal LO. For an input frequency of 4 Ghz, phase noise present on enable signal 185 may be as large as 250 picoseconds, rather than a specification of less than 10 picoseconds of phase noise present on output signal 186. In one example, the enable signal may be delayed by more than 25% of the period of oscillation of input signal LO while the output signal is delayed by less than 10% of the period of oscillation of input signal LO. Due to this relatively lenient specification for phase noise, low power frequency divider 130 may be constructed from relatively small transistors that consume less power and can be driven to generate rail to rail output signals with relatively small input current. Thus, the current level of signal 182 may be smaller, thus reducing the power requirements for input buffer 125. The second portion, signal 184, is communicated directly to high speed latch 131. Signal 184 drives relatively large transistors that are less susceptible to noise sources. For example, phase noise present on output signal 186 may be less than 10 picoseconds. Because high speed latch 131 is a simple latch circuit, rather than a complex frequency divider circuit, relatively few large transistors are required. With fewer large transistors, the phase noise specification on output signal 186 may be met with reduced supply current and a smaller current level of signal 184. By operation of a latch circuit of high speed latch 131, the phase noise on output signal 186 is derived from the phase noise present on signal 184, and not on the phase noise of enable signal 185. For this reason, a relatively large amount of phase noise present on enable signal 185 may be tolerated as long as the noise level does not exceed one half of the period of oscillation of input signal LO. For this reason, the transistors of low power frequency divider 130 may be small relative to the transistors of high speed latch 131. Although low power frequency divider 130 includes more transistors than high speed latch 131, in one example, approximately half of the current of input signal LO is directed to low power frequency divider 130 and the remaining portion to high speed latch 130. In this manner, a balance is achieved between the input current consumed by the low power frequency divider and the high speed latch. In one example, the overall current consumed by parallel path frequency divider 113 is half of the current consumed by a series frequency divider to achieve a phase noise of less than ten picoseconds on a two gigahertz output signal.

Figure 6:
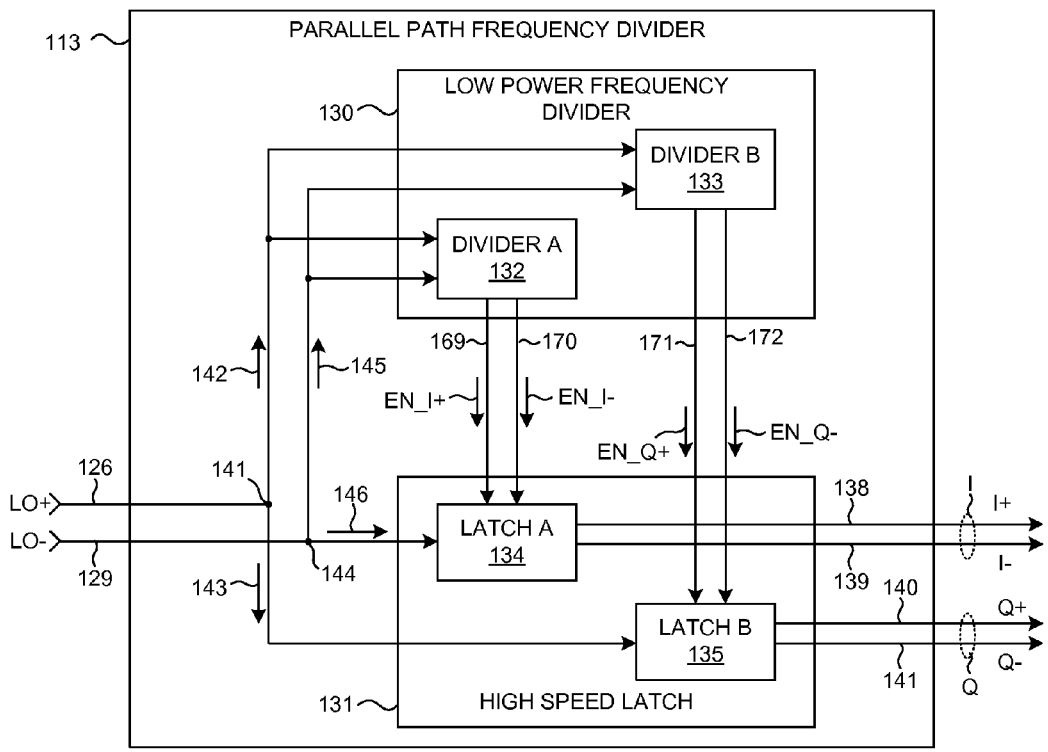
FIG. 6 is a detailed diagram of parallel path frequency divider 113 configured to generate divided down differential output signals from a differential input signal.

FIG. 6 is a more detailed diagram of frequency divider 113 of the receive chain 108 of the RF transceiver integrated circuit 102 of FIG. 3. PPFD 113 includes a low power frequency divider 130 including two frequency divider circuits, divider 132 and divider 133. PPFD 113 also includes high speed latch 131 including two high speed latch circuits, latch 134 and latch 135. As depicted PPFD 113 operates to frequency divide differential input signals (LO+ and LO−) to generate divided-down output signals (I+, I−, Q+, Q−) in phase quadrature. Signal LO+ is communicated to oscillatory input node 141 over conductor 126. Signal LO+, present on input node 141 is divided in current into two portions, signal portion 142 and signal portion 143. Signal 142 is communicated to both divider 132 and divider 133 of low power frequency divider 130. Signal 143 is communicated to latch 135. Signal LO− is communicated to oscillatory input node 144 over conductor 129. Signal LO−, present on input node 144 is divided in current into two portions, signal portion 145 and signal portion 146. Signal 145 is communicated to both divider 132 and divider 133 of low power frequency divider 130. Signal 146 is communicated to latch 134. In this manner, differential input signal LO is divided into two parallel portions. Divider 132 receives a portion of signal 142 and a portion of signal 145 and generates enable signals EN_I+ and EN_I−. Signal EN_I+ is communicated to latch 134 over conductor 169 and signal EN_I− is communicated to latch 134 over conductor 170. Each of enable signals EN_I+ and EN_I− is divided down in frequency. In one example, divider 132 divides input signal LO by two in frequency. Latch 134 receives enable signals EN_I+ and EN_I− and signal 146 and generates divided down output signals I+, communicated over output lead 138, and I−, communicated over output lead 139. Similarly, divider 133 receives a portion of signal 142 and a portion of signal 145 and generates enable signals EN_Q+ and EN_Q−. Signal EN_Q+ is communicated to latch 134 over conductor 171 and signal EN_Q− is communicated to latch 135 over conductor 172. Each of enable signals EN_Q+ and EN_Q− is divided down in frequency from LO to a lower frequency. In one example, divider 133 divides input signal LO by two in frequency. Latch 135 receives enable signals EN_Q+ and EN_Q− and signal 143 and generates divided down output signals Q+, communicated over output lead 140, and Q−, communicated over output lead 141. Together I+, I−, Q+, and Q− are four divided-down oscillatory signals in phase quadrature.

Figure 7:
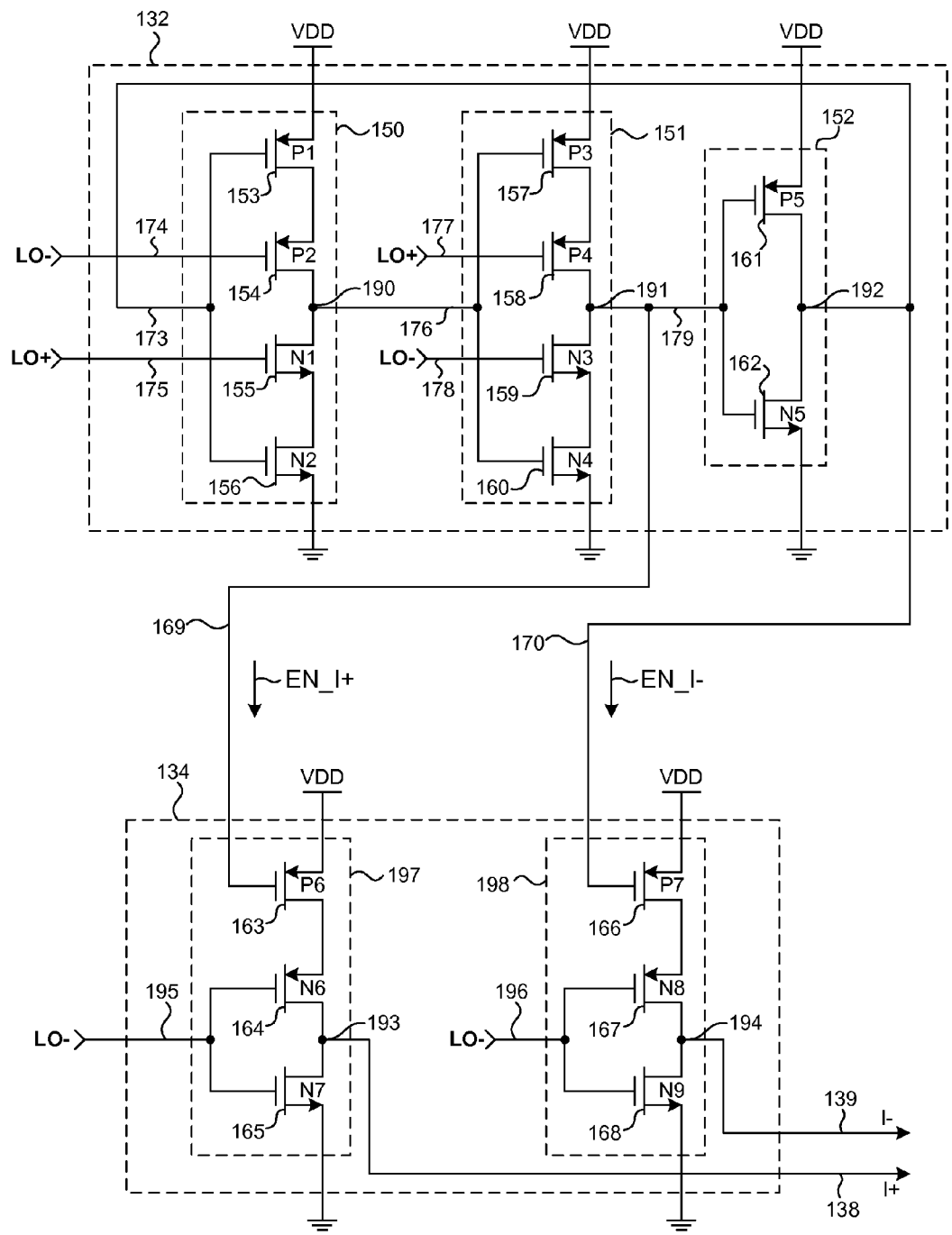
FIG. 7 is a more detailed diagram of low power frequency divider 132 and high speed latch circuit 134 of FIG. 6.

FIG. 7 is a more detailed diagram of divider 132 of low power frequency divider 130 and latch 134 of high speed latch 131 of PPFD 113. Divider 132 includes a first tri-state inverter 150, a second tri-state inverter 151, and inverter 152. Tri-state inverter 150 includes P-channel transistor 153 (P1), P-channel transistor 154 (P2), N-channel transistor 155 (N1), N-channel transistor 156 (N2), input lead 173, control input lead 174, control input lead 175, and output node 190. Each transistor includes a source, a drain, and a gate. The source of P1 is coupled to a voltage source supplying voltage, VDD. The drain of P1 is coupled to the source of P2. The drain of P2 is coupled to the source of N1 and output node 190. The drain of N1 is coupled to the source of N2. The drain of N2 is coupled to a voltage source supplying a ground voltage. Control input lead 174 is coupled to the gate of P2. Control input lead 175 is coupled to the gate of N1. The gates of transistors P1 and N2 are coupled to input lead 173. Tri-state inverter 151 includes P-channel transistor 157 (P3), P-channel transistor 158 (P4), N-channel transistor 159 (N3), N-channel transistor 160 (N4), input lead 176, control input lead 177, control input lead 178, and output node 191. Each transistor includes a source, a drain, and a gate. The source of P3 is coupled to a voltage source supplying voltage, VDD. The drain of P3 is coupled to the source of P4. The drain of P4 is coupled to the source of N3 and output node 191. The drain of N3 is coupled to the source of N4. The drain of N4 is coupled to a voltage source supplying a ground voltage. Control input lead 177 is coupled to the gate of P4. Control input lead 178 is coupled to the gate of N3. The gates of transistors P3 and N4 are coupled to input lead 176. Input lead 176 of tri-state inverter 151 is coupled to output node 190 of tri-state inverter 150. Inverter 152 includes P-channel transistor 161 (P5), N-channel transistor 162 (N5), input lead 179, and output node 192. The source of P5 is coupled to a voltage source supplying voltage, VDD. The drain of P5 is coupled to the source of N5 and to output node 192 of inverter 152. The drain of N5 is coupled to a voltage source supplying a ground voltage. The gates of transistors P5 and N5 are coupled to input lead 179. Input lead 179 of inverter 152 is coupled to output node 191 of tri-state inverter 151. Input lead 173 of tri-state inverter 150 is coupled to output node 192 of inverter 152. A portion of signal LO− is communicated over control input lead 174 of tri-state inverter 150 and over control input lead 178 of tri-state inverter 151. A portion of signal LO+ is communicated over control input lead 175 of tri-state inverter 150 and over control input lead 177 of tri-state inverter 151. EN_I+ is present at output node 191 of tri-state inverter 151. EN_I+ is communicated from output node 191 of divider 132 to latch 134 over conductor 169. EN_I− is present at output node 192 of inverter 152. EN_I− is communicated from output node 192 of divider 132 to latch 134 over conductor 170.

Latch 134 includes a first latch circuit 197 and a second latch circuit 198. Latch circuit 197 includes P-channel transistor 163 (P6), N-channel transistor 164 (N6), N-channel transistor 165 (N7), input lead 195, control input lead 169, and output node 193. Each transistor includes a source, a drain, and a gate. The source of P6 is coupled to a voltage source supplying voltage, VDD. The drain of P6 is coupled to the source of N6. The drain of N6 is coupled to the source of N7 and output node 193. The drain of N7 is coupled to a voltage source supplying a ground voltage. Control input lead 169 is coupled to the gate of P6. The gates of transistors N6 and N7 are coupled to input lead 195. In this manner, an input signal present on input lead 195 supplies current to no more than two transistors to generate the output signal. Latch circuit 198 includes P-channel transistor 166 (P7), N-channel transistor 167 (N8), N-channel transistor 168 (N9), input lead 196, control input lead 170, and output node 194. Each transistor includes a source, a drain, and a gate. The source of P7 is coupled to a voltage source supplying voltage, VDD. The drain of P7 is coupled to the source of N8. The drain of N8 is coupled to the source of N9 and output node 194. The drain of N9 is coupled to a voltage source supplying a ground voltage. Control input lead 170 is coupled to the gate of P7. The gates of transistors N8 and N9 are coupled to input lead 196. In this manner, an input signal present on input lead 196 supplies current to no more than two transistors to generate the output signal. A portion of signal LO− is communicated over control input lead 195 of inverter 197 and over control input lead 196 of inverter 198. Signal I+ is present at output node 193 of latch 197. Signal I+ is communicated from output node 193 of latch 134 over conductor 138. Signal I− is present at output node 194 of latch 198. Signal I− is communicated from output node 194 of latch 134 over conductor 139.

Figure 8:
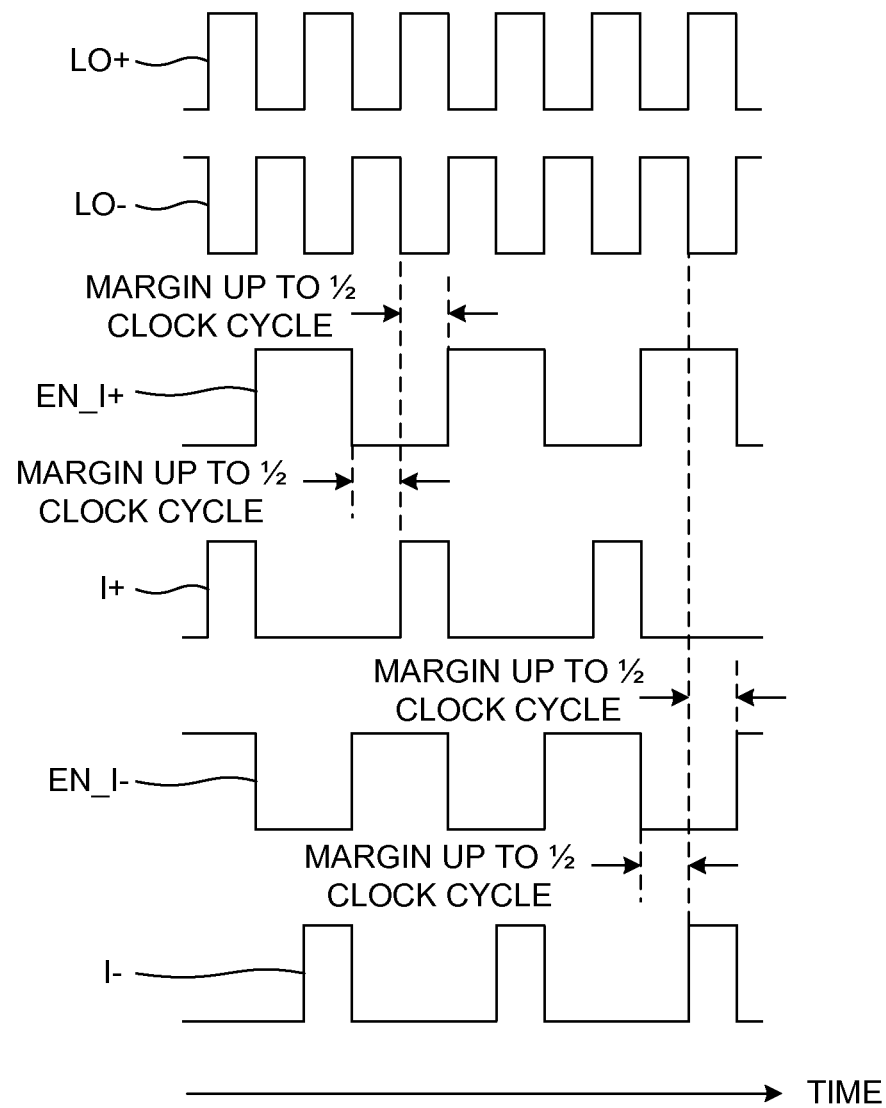
FIG. 8 is illustrative of the input and output waveforms of low power frequency divider 132 and high speed latch circuit 134 of FIG. 7.

FIG. 8 illustrates exemplary waveforms of signals generated by divider 132 and latch 134 of FIG. 7. As discussed with respect to FIG. 7, signals LO+ and LO− are supplied to divider 132 and LO− is supplied to latch 134. As configured in FIG. 7, divider 132 generates enable signals, EN_I+ and EN_I− from signals LO+ and LO−. As ideally depicted in FIG. 8, divider 132 operates to frequency divide signals LO+ and LO− by a factor of two to generate signals EN_I+ and EN_I−. Signals EN_I+ and EN_I− are fifty percent duty cycle signals and EN_I+ and EN_I− are one hundred and eighty degrees out of phase from one another. Latch 134 operates to receive the enable signals and signal LO− and generates frequency divided, 25% duty cycle signals I+ and I−. Latch 134 operates at a relatively high slew rate to minimize the amount of additional phase noise that might be added to signals I+ and I−. Although latch 134 propagates phase noise present on signal LO−, it does not propagate phase noise present on enable signals EN_I+ and EN_I− as long as the phase noise present on the enable signals does not exceed one half of a clock cycle of input signal LO−. By action of latch 134, signal I+ does not latch high until EN_I+ is low and signal LO− is low. In other words, for I+ to transition high when LO− falls low, EN_I+ must be low. Under the ideal circumstances depicted in FIG. 8, EN_I+ is low for one half of a clock cycle of LO− before LO− falls low and for one half of a clock cycle of LO− after LO− falls low. Thus, phase noise present on signal EN_I+ may be up to one half of the clock cycle of signal LO− without adding to the phase noise present on signal I+. Similarly, phase noise present on signal EN_I− may be up to one half of the clock cycle of signal LO− without adding to the phase noise present on signal I−.

Figure 9:
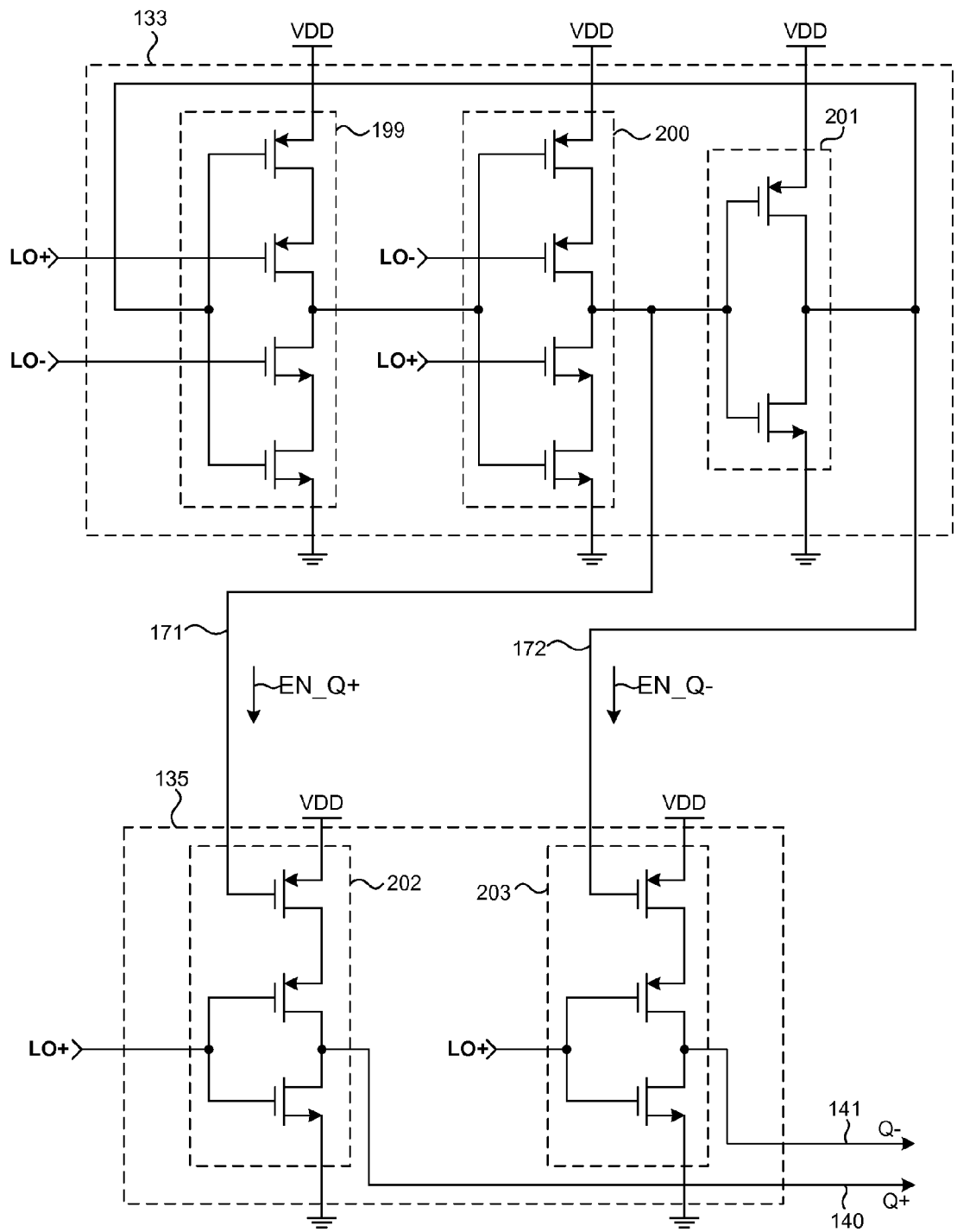
FIG. 9 is a more detailed diagram of low power frequency divider 133 and high speed latch circuit 135 of FIG. 6.

FIG. 9 is a more detailed diagram of divider 133 of low power frequency divider 130 and latch 135 of high speed latch 131 of PPFD 113. Divider 133 is analogous to divider 132. Divider 133 includes a first tri-state inverter 199, a second tri-state inverter 200, and inverter 201. Latch 135 includes a first latch circuit 202 and a second latch circuit 203. As depicted, tri-state inverter 199 of divider 133 is driven by differential input signal LO in opposite polarity as tri-state inverter 150 of divider 132. Similarly, tri-state inverter 200 of divider 133 is driven by differential input signal LO in opposite polarity as tri-state inverter 151 of divider 132. Signal EN_Q+ is communicated from divider 133 to latch circuit 202 over conductor 171. Signal EN_Q− is communicated from divider 133 to latch circuit 203 over conductor 172. Both latch circuits 202 and 203 are driven by signal LO+. Signal Q+ is communicated from latch circuit 202 of latch 135 over conductor 140. Signal Q− is communicated from latch circuit 203 of latch 135 over conductor 141.

Figure 10:
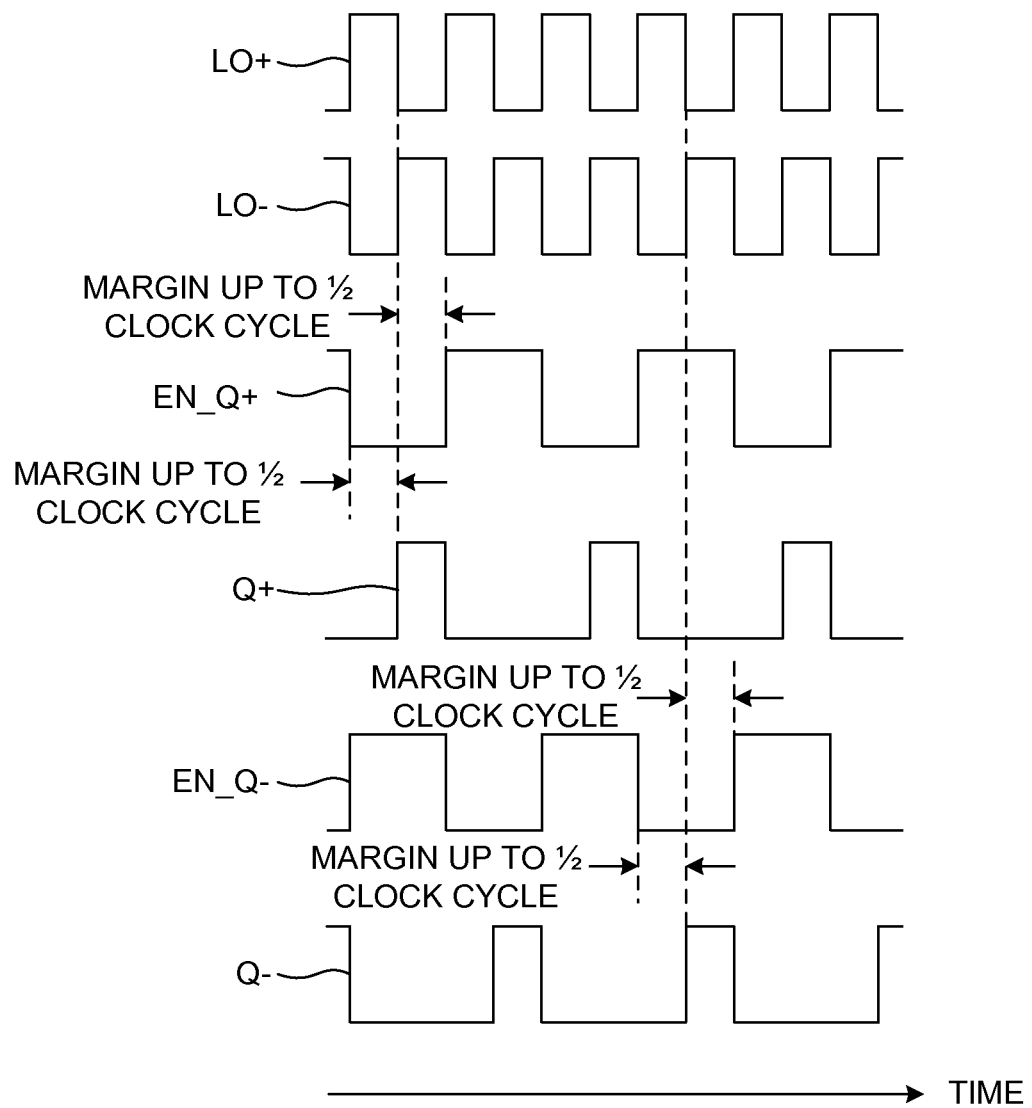
FIG. 10 is illustrative of the input and output waveforms of low power frequency divider 133 and high speed latch circuit 135 of FIG. 9.

FIG. 10 illustrates exemplary waveforms of signals generated by divider 133 and latch 135 of FIG. 9. As discussed with respect to FIG. 9, signals LO+ and LO− are supplied to divider 133 and LO+ is supplied to latch 135. As configured in FIG. 9, divider 133 generates enable signals, EN_Q+ and EN_Q− from signals LO+ and LO−. As ideally depicted in FIG. 10, divider 133 operates to frequency divide signals LO+ and LO− by a factor of two to generate signals EN_Q+ and EN_Q−. Signals EN_Q+ and EN_Q− are fifty percent duty cycle signals and EN_Q+ and EN_Q− are one hundred and eighty degrees out of phase from one another. Latch 135 operates to receive the enable signals and signal LO+ to generate frequency divided, 25% duty cycle signals Q+ and Q−. Latch 135 operates at a relatively high slew rate to minimize the amount of additional phase noise that might be added to signals Q+ and Q−. Although latch 135 propagates phase noise present on signal LO+, it does not propagate phase noise present on enable signals EN_Q+ and EN_Q− as long as the phase noise present on the enable signals does not exceed one half of a clock cycle of input signal LO+. By action of latch 135, signal Q+ does not latch high until EN_Q+ is low and signal LO+ is low. In other words, for Q+ to transition high when LO+ falls low, EN_Q+ must be low. Under the ideal circumstances depicted in FIG. 10, EN_Q+ is low for one half of a clock cycle of LO+ before LO+ falls low and for one half of a clock cycle of LO+ after LO+ falls low. Thus, phase noise present on signal EN_Q+ may be up to one half of the clock cycle of signal LO+ without adding to the phase noise present on signal Q+. Similarly, phase noise present on signal EN_Q− may be up to one half of the clock cycle of signal LO+ without adding to the phase noise present on signal Q−.

Figure 11:
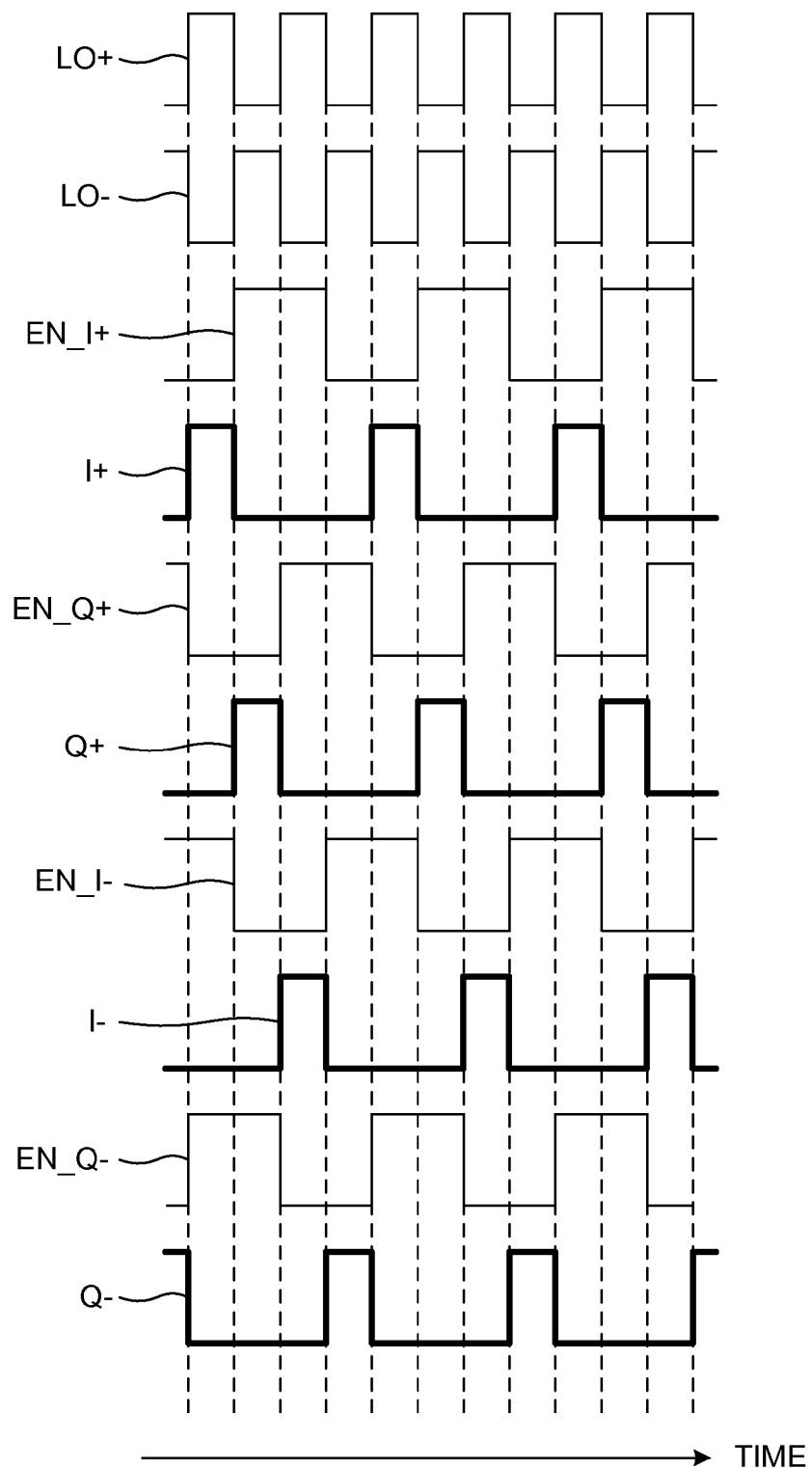
FIG. 11 is illustrative of the input and output waveforms of parallel path frequency divider 113 of FIG. 6

FIG. 11 illustrates exemplary waveforms of signals generated by low power frequency divider 130 and high speed latch 131 of FIG. 6 in the embodiment more fully described with respect to FIGS. 7-10. Low power frequency divider 130 operates to generate enable signals, EN_I+, EN_Q+, EN_I−, and EN_Q−. As depicted, signals EN_I+, EN_Q+, EN_I−, and EN_Q− are fifty percent duty cycle signals that are ninety degrees out of phase with one another. In addition, signals EN_I+, EN_Q+, EN_I−, and EN_Q− are frequency divided by a factor of two from differential signal, LO. High speed latch 131 operates to generate output signals I+, Q+, I−, and Q−. As depicted, output signals I+, Q+, I−, and Q− are twenty five percent duty cycle signals that are ninety degrees out of phase with one another. In addition, signals I+, Q+, I−, and Q− are frequency divided by a factor of two from differential input signal, LO.

Figure 12:
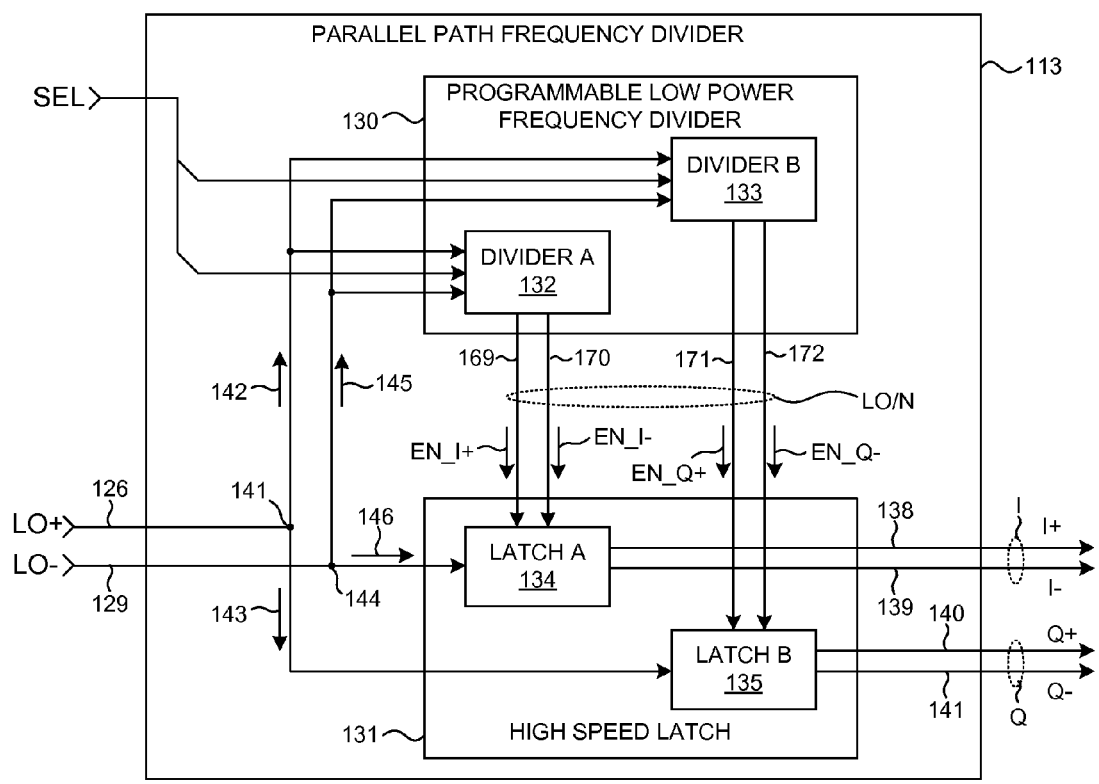
FIG. 12 is illustrative of a second embodiment of parallel path frequency divider 113.

FIG. 12 illustrates PPFD 113 in a second embodiment. In the present embodiment, PPFD 113 includes a programmable low power frequency divider 130 including two programmable frequency divider circuits, divider 132 and divider 133. Programmable low power frequency divider 130 operates to frequency divide differential input signal, LO by a selectable integer value, N. In one example, programmable frequency divider 130 frequency divides differential input signal LO by a factor of two in one configuration and by a factor of four in another configuration. In other examples, frequency division by other integer values (e.g. two, three, four, six, eight) may be performed. Selectable integer value, N, is determined by binary digital selection signal, SEL. SEL is received by programmable low power frequency divider 130. Based on the value of SEL, divider 130 is configured to frequency divide differential input signal LO by the desired integer value.

Figure 13:
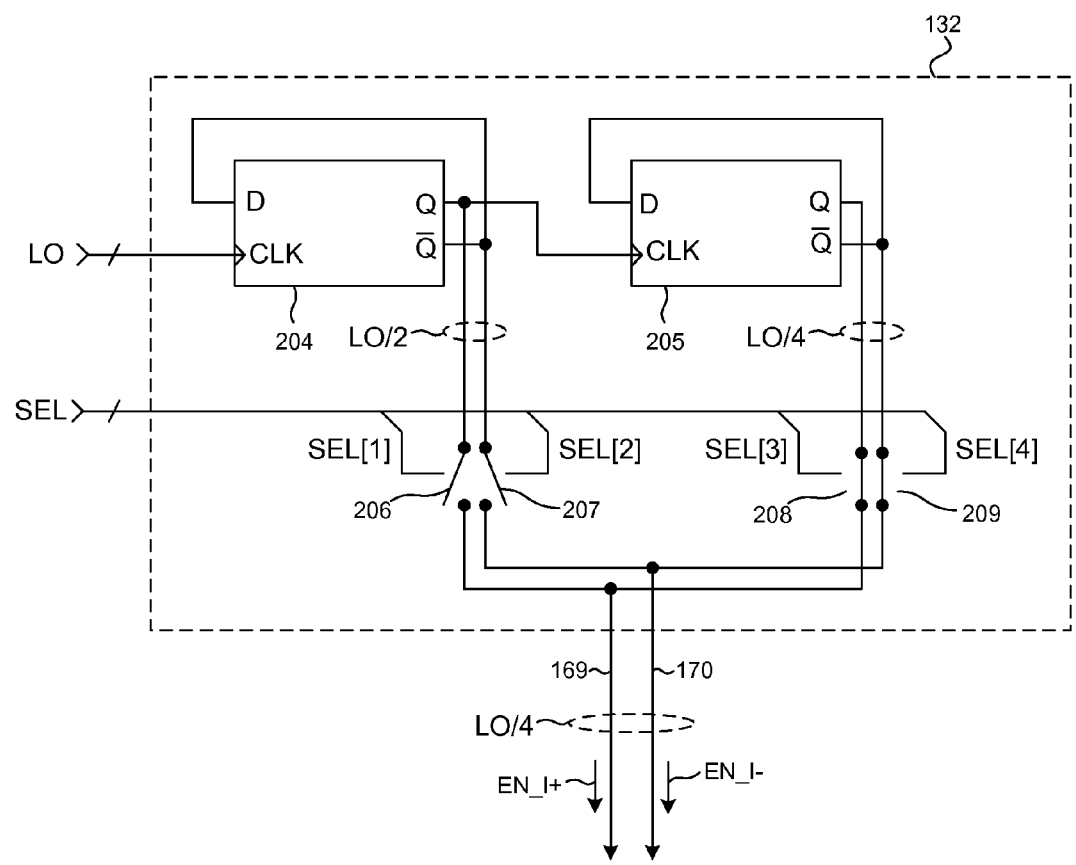
FIG. 13 is illustrative of a programmable low power frequency divider 132 of parallel path frequency divider 113 of FIG. 12.

FIG. 13 illustrates programmable frequency divider circuit 132 of programmable low power frequency divider 130 in greater detail. Divider circuit 132 includes a first data latch (D-latch) circuit 204 and a second data latch (D-latch) circuit 205. In one example, each of D-latch circuits 204 and 205 may be configured as described with respect to divider circuit 132 depicted in FIG. 7. Circuit 204 frequency divides differential input signal LO by a factor of two and generates a divided-down differential output signal, LO/2, present at the output and inverted output of D-latch 204. The output, Q, of D-latch circuit 204 is coupled to the clock input of D-latch circuit 205. In this manner, D-latch circuit 205 frequency divides divided-down output signal, LO/2 by an additional factor of two and outputs a divided-down differential output signal, LO/4, present at the output and inverted output of D-latch 205. Divider circuit 132 also includes switching elements 206-209. Switching element 206 selectively couples the output of D-latch circuit 204 to conductor 169. Switching element 207 selectively couples the inverted output of D-latch circuit 204 to conductor 170. Switching element 208 selectively couples the output of D-latch circuit 205 to conductor 169. Switching element 208 selectively couples the inverted output of D-latch circuit 205 to conductor 170. As depicted, binary digital signal, SEL, commands switching elements 206 and 207 to be substantially non-conductive and switching elements 208 and 209 to be substantially conductive. In this configuration, the output and inverted output of D-latch circuit 205 are coupled to conductors 169 and 170, respectively. In this manner, enable signals EN_I+ present on conductor 169 and EN_I− present on conductor 170 are frequency divided by a factor of four. In an alternative configuration, SEL, commands switching elements 206 and 207 to be substantially conductive and switching elements 208 and 209 to be substantially non-conductive. In this configuration, the output and inverted output of D-latch circuit 204 are coupled to conductors 169 and 170 respectively. In this manner, enable signals EN_I+ present on conductor 169 and signal EN_I− present on conductor 170 are frequency divided by a factor of two.

Figure 14:
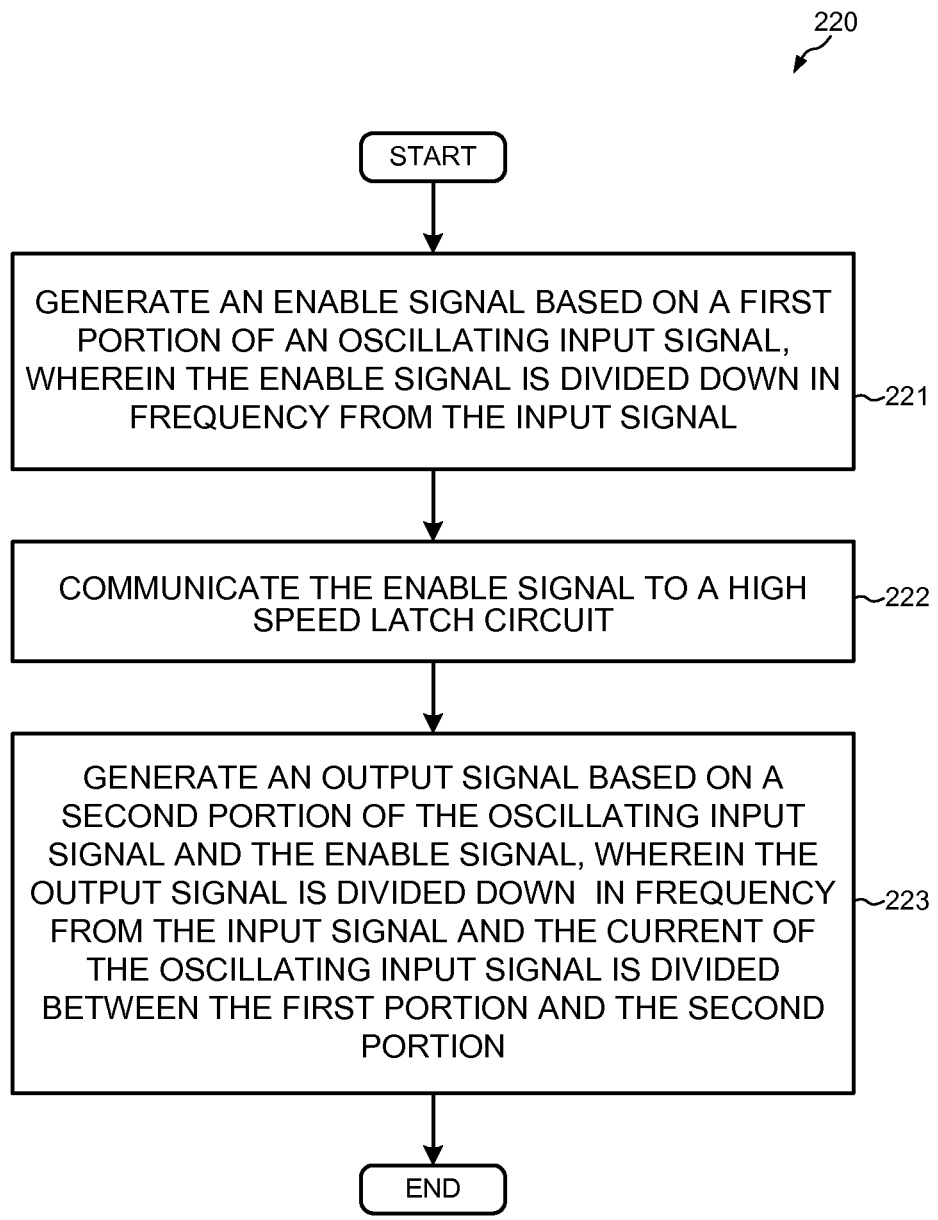
FIG. 14 is a flowchart of a method in accordance with one aspect.

FIG. 14 is a flowchart of a method 220 in accordance with one aspect. In a step 221, a PPFD 113 generates an enable signal based on a first portion of an oscillating input signal. The enable signal is divided down in frequency from the input signal. In a step 222, the enable signal is communicated to a high speed latch circuit of the PPFD 113. In a step 223, the PPFD 113 generates an output signal based on a second portion of the oscillating input signal and the enable signal. The output signal is divided down in frequency from the input signal. The current of the oscillating input signal is divided between the first portion and the second portion of the oscillating input signal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

In one illustrative example, a set of processor-executable instructions 211 is stored in a memory (a processor-readable medium) 212 in digital baseband integrated circuit 103 of FIG. 2. Processor 210 accesses memory 212 across a bus and executes the instructions 211, thereby causing integrated circuit 103 to configure and control and monitor frequency divider 113 in receive chain 108 of the RF transceiver integrated circuit 102.

Although certain specific embodiments are described above for instructional purposes, the teachings of this patent document have general applicability and are not limited to the specific embodiments described above. For example, a frequency divider has been described in this application as including a low power frequency divider and a high speed latch, although the low power frequency divider could include latching functionality and the high speed latch could include frequency dividing capability. Accordingly, various modifications, adaptations, and combinations of the various features of the described specific embodiments can be practiced without departing from the scope of the claims that are set forth below.

What is claimed is:

1. A frequency divider comprising:
a first local oscillating input node;
a low power frequency divider coupled to the first local oscillating input node, wherein the low power frequency divider generates a first enable signal in response to a local oscillating input signal present on the first local oscillating input node; and
a high speed latch coupled to the first local oscillating input node and the low power frequency divider, wherein the high speed latch generates an output signal in response to the local oscillating input signal and the first enable signal, wherein the output signal is divided in frequency from the local oscillating input signal;
wherein the low power frequency divider comprises a plurality of divider transistors and the high speed latch comprises a plurality of latch transistors larger relative to the plurality of divider transistors;
and further wherein approximately half of a current at the first local oscillating input node is directed to the low power frequency divider and remaining current is directed to the high speed latch.

2. The frequency divider of claim 1, wherein the low power frequency divider comprises:
a first divider circuit coupled to the first local oscillating input node and a second local oscillating input node, wherein the first divider circuit generates the first enable signal and a second enable signal in response to a differential input signal present on the first and second local oscillating input nodes; and
a second divider circuit coupled to the first local oscillating input node and the second local oscillating input node, wherein the second divider circuit generates a third enable signal and a fourth enable signal in response to the differential input signal present on the first and second local oscillating input nodes; and
wherein the high speed latch comprises:
a first latch circuit coupled to the second local oscillating input node and the first divider circuit, wherein the first latch circuit generates a first differential output signal in response to the first and second enable signals; and
a second latch circuit coupled to the first local oscillating input node and coupled to the second divider circuit, wherein the second latch circuit generates a second differential output signal in response to the third and fourth enable signals.

3. The frequency divider of claim 2, wherein the first differential output signal is an in-phase (I) differential output signal, wherein the second differential output signal is a quadrature (Q) differential output signal, and wherein the I differential output signal and the Q differential output signal are in phase quadrature.

4. The frequency divider of claim 2, wherein the low power frequency divider comprises a first tri-state inverter including an input lead, a first control input lead, a second control input lead, and an output node, a second tri-state inverter including an input lead, a first control input lead, a second control input lead, and an output node, and an inverter including an input lead and an output node, wherein the output node of the first tri-state inverter is coupled to the input lead of the second tri-state inverter, wherein the output node of the second tri-state inverter is coupled to the input lead of the inverter, wherein the output node of the inverter is coupled to the input lead of the first tri-state inverter, wherein the first enable signal is present on the output node of the second tri-state inverter, and wherein the second enable signal is present on the output node of the inverter.

5. The frequency divider of claim 4, wherein the first control input lead of the first tri-state inverter and the second control input lead of the second tri-state inverter are coupled to the second local oscillating input node, and wherein the second control input lead of the first tri-state inverter and the first control input lead of the second tri-state inverter are coupled to the first local oscillating input node.

6. The frequency divider of claim 2, wherein the high speed latch comprises a first N-channel transistor, a second N-channel transistor, and a P-channel transistor, wherein a gate of the P-channel transistor is coupled to the output node of the second tri-state inverter, wherein a drain of the P-channel transistor is coupled to a source of the first N-channel transistor, wherein a drain of the first N-channel transistor is coupled to a source of the second N-channel transistor, wherein the gates of the first N-channel transistor and the second N-channel transistor are coupled to the second local oscillating input node, and wherein the drain of the first N-channel transistor is coupled to a first output node of the high speed latch.

7. The frequency divider of claim 1, wherein a first portion of the local oscillating input signal at the first local oscillating node is communicated to the low power frequency divider, and wherein a second portion of the local oscillating input signal is communicated to the high speed latch.

8. The frequency divider of claim 7, wherein the first portion of the local oscillating input signal is less than the second portion of the local oscillating input signal.

9. The frequency divider of claim 1, wherein the local oscillating input signal oscillates at a first frequency, wherein the first enable signal oscillates at a second frequency, and wherein the first frequency is twice the second frequency.

10. The frequency divider of claim 9, wherein the output signal oscillates at the second frequency with a twenty five percent duty cycle.

11. The frequency divider of claim 1, wherein the first enable signal is delayed by more than twenty five percent of a period of oscillation of the local oscillatory input signal, and wherein the output signal is delayed by less than ten percent of the period of oscillation of the local oscillatory input signal.

12. The frequency divider of claim 1, wherein the local oscillating input signal supplies current to no more than two transistors of the high speed latch to generate the output signal.

13. A method comprising:
generating an enable signal based on a first portion of a current of a local oscillating input signal, wherein the enable signal is divided down in frequency from the local oscillating input signal;
communicating the enable signal to a high speed latch; and
generating an output signal based on a second portion of the current of the local oscillating input signal and the enable signal, wherein the output signal is divided down in frequency from the local oscillating input signal;
wherein the enable signal is generated by a plurality of first transistors and the high speed latch comprises a plurality of second transistors larger relative to the plurality of first transistors;
and further wherein the first portion of the current is approximately half of a received current and the second portion of the current is remaining current of the received current.

14. The method of claim 13, wherein the generating of the enable signal is performed by a low power frequency divider circuit, and wherein the generating of the output signal is performed by the high speed latch.

15. The method of claim 13, wherein the generating of the output signal includes latching a voltage present on an output node of the high speed latch to a first voltage state in response to a digital high state of the second portion of the local oscillating input signal and a digital high state of the enable signal.

16. The method of claim 13, wherein a phase noise present on the output signal is less than a phase noise present on the enable signal.

17. The method of claim 13, wherein a phase noise present on the enable signal is greater than ten percent of a period of oscillation of the local oscillating input signal.

18. The method of claim 13, wherein the second portion of the local oscillating input signal supplies current to no more than two transistors of the high speed latch to generate the output signal.

19. A frequency divider comprising:
a local oscillating input node that receives a first local oscillating input signal onto the frequency divider; and
means for frequency dividing the first local oscillating input signal by a fixed integer thereby generating a frequency divided output signal, wherein the means includes a low power frequency divider that receives a first portion of the local oscillating input signal and a high speed latch that receives a second portion of the local oscillating input signal and an enable signal from the low power frequency divider;
wherein the low power frequency divider comprises a plurality of divider transistors and the high speed latch comprises a plurality of latch transistors larger relative to the plurality of divider transistors;
and further wherein approximately half of a current at the local oscillating input node is directed to the low power frequency divider and remaining current is directed to the high speed latch.

20. The frequency divider of claim 19, wherein the low power frequency divider is coupled to the high speed latch, wherein the low power frequency divider generates the enable signal that is communicated to the high speed latch, and wherein the high speed latch generates the frequency divided output signal based on the second portion of the local oscillating input signal and the enable signal.

21. The frequency divider of claim 19, further comprising:
a second local oscillating input node that receives a second local oscillating input signal onto the frequency divider, wherein the first local oscillating input signal and the second local oscillating input signal are a differential input signal, wherein the frequency divided output signal is an in-phase (I) differential output signal, and wherein the means frequency divides the second local oscillating input signal thereby generating a quadrature (Q) differential output signal.

* * * * *